United States Patent [19]

Dean

[11] B 3,920,861

[45] Nov. 18, 1975

[54] METHOD OF MAKING A SEMICONDUCTOR DEVICE

[75] Inventor: Raymond Harkless Dean, Lawrenceville, N.J.

[73] Assignee: RCA Corporation, New York, N.Y.

[22] Filed: Dec. 18, 1972

[21] Appl. No.: 316,014

[44] Published under the Trial Voluntary Protest Program on January 28, 1975 as document no. B 316,014.

[52] U.S. Cl. .................... 427/88; 427/89; 427/123; 156/17; 357/22; 357/23

[51] Int. Cl.$^2$........................ H01L 7/00; B05D 5/12

[58] Field of Search...... 117/212, 217, 227; 156/17; 317/235, 21.1 B, 235 AG, 234 M

[56] References Cited

UNITED STATES PATENTS

| | | | |
|---|---|---|---|
| 3,490,943 | 1/1970 | Werdt | 117/212 |
| 3,675,313 | 7/1972 | Driver | 29/573 |
| 3,678,573 | 7/1972 | Driver | 29/571 |
| 3,716,429 | 2/1973 | Napoli | 156/17 |
| 3,752,702 | 8/1973 | Jzuka | 117/212 |
| 3,764,865 | 10/1973 | Napoli | 317/235 R |
| 3,769,109 | 10/1973 | MacRae | 156/3 |

*Primary Examiner*—Cameron K. Weiffenbach
*Assistant Examiner*—M. F. Esposito
*Attorney, Agent, or Firm*—Edward J. Norton; Joseph D. Lazar; Michael A. Lechter

[57] ABSTRACT

A semiconductor device having a pair of laterally spaced metal films on a body of a single crystalline semiconductor material and a groove in the body between the pair of metal films. A third metal film having a thickness slightly less than the depth of the groove is on the bottom of the groove and has an edge which is in substantially transverse alignment with an edge of one of the pair of metal films so that the third metal film is in closely spaced relation to the one metal film. The third metal film can be very narrow, as narrow as less than 1.5 microns. In making the semiconductor device the width of the third metal film is determined by the width of the space in which the third metal film is deposited, the space width being defined, in turn, by a highly controllable etching operation.

11 Claims, 36 Drawing Figures

METHOD OF MAKING A SEMICONDUCTOR DEVICE

The invention herein disclosed was made in the course of or under a contract or subcontract thereunder with the Department of the Air Force.

BACKGROUND OF THE INVENTION

The present invention relates to a method of making a semiconductor device. More particularly, the present invention relates to a method of making a semiconductor device having on a body of a semiconductor material at least three metal contacts in substantially side-by-side relation with an intermediate contact being very narrow and having an edge in closely spaced relation with an adjacent contact.

Many semiconductor devices have two or more metal film areas on a surface of a body of semiconductor material. For such devices it is often desirable to have the metal film areas as close as possible to each other without contacting so as to minimize the size of the device and/or improve the electrical characteristics of the device. For example, a field effect transistor in general comprises a body of a semiconductor material having spaced source and drain metal film contacts on the body and a channel in the body between the source and drain. A metal film gate contact is provided over the body between the source and drain. The gate may be a junction gate wherein a rectifying junction is provided between the gate and the body, or an insulated gate wherein a layer of an electrical insulating material is provided between the body and the gate. In such a field effect transistor it is desirable to have the distance between the gate and at least the source contact as close as possible to provide the device with good operating characteristics.

There has been developed a field effect transistor semiconductor device having a gate in very close relation with each of the source and drain contacts. This device comprises a body of the semiconductor device having the source and drain metal film contacts on a surface thereof and in spaced relation. A groove is in the body between the source and drain contacts with the groove extending under the adjacent edges of the source and drain contacts. Thus, the adjacent edges of the source and drain contacts overhang the groove in cantilever fashion. The metal film gate is on the bottom of the groove and the edges of the gate are in substantial transverse alignment with the overhanging edges of the source and drain contacts. By making the gate of a thickness slightly less than the depth of the groove, the edges of the gate are in very close relation with the overhanging edges of the source and drain contacts but do not contact them.

For certain types of semiconductor devices such as the field effect transistor, particularly those which are capable of operating at high frequencies, it is not only desirable to have the contacts in closely spaced relation but also to have one of the contacts, such as the gate contact, of a very narrow width, e.g., less than about 1.5 microns. Heretofore, the width of the contacts were most conveniently defined by standard photolithographic techniques wherein a mask is used to define the widths of the metal contacts. Using such techniques it is very difficult, if at all possible, to form masks which will define regions having a width less than about 1.5 microns.

SUMMARY OF THE INVENTION

A semiconductor device comprises a body of a single crystalline semiconductor material having first and second laterally spaced metal films thereon. A groove is in the body between the first and second metal films and a layer of a masking material is on the body between the first metal film and the groove. At least one of the second metal film or the masking layer extends in cantilever fashion beyond an edge of the groove and over the groove. A third metal film is on the bottom of the groove and has an edge which is in substantially transverse alignment with the cantilevered edge of the second metal film or the masking layer.

The semiconductor device is made by coating a first surface area of a body of a single crystalline semiconductor material with a first metal film. A second surface area of the body which is juxtaposed to the first surface area is coated with a layer of a masking material with an edge of the masking layer extending at least to an edge of the first metal film. A portion of the masking layer is etched away from the edge to expose a portion of the body between the edges of the first metal film and the masking layer. A groove is etched in the exposed portion of the body with the groove extending under at least one of the edges of the first metal film or the masking layer so that said edge extends in cantilever fashion over the groove. A second metal film is deposited on the bottom of the groove with an edge of the second metal film being in substantially transverse alignment with the cantilevered edge of the first metal film or the masking layer.

DETAILED DESCRIPTION

Figure 1:
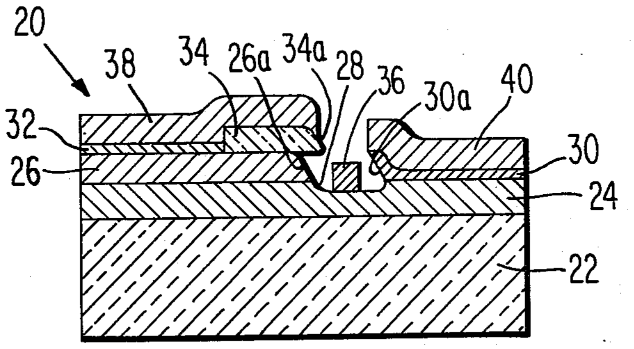
FIG. 1 is a sectional view of one form of the semiconductor device of the present invention.

Referring initially to FIG. 1, one form of the semiconductor device of the present invention generally designated as 20, is a field effect transistor having a Schottky surface barrier junction gate. The transistor 20 comprises a flat substrate 22 of an electrically insulating or semi-insulating material having on a surface thereof a first layer 24 of a semiconductor material of one conductivity type, either P type or N type. A second layer 26 of the same semiconductor material and the same conductivity type as the first semiconductor layer 24 is on a portion of the surface of the first semiconductor layer 24. However, the second semiconductor layer 26 contains a higher concentration of the particular conductivity modifier so as to be of a lower resistance than the first semiconductor layer 24. The first and second semiconductor layers 24 and 26 may be of any well known semiconductor material, such as silicon, germanium or a group III–V compound semiconductor material, which contains a suitable conductivity modifier. The substrate 22 may be of any well known insulating or semi-insulating material on which the particular semiconductor material of the first and second semiconductor layers 24 and 26 can be epitaxially deposited, such as sapphire, spinel or the same semiconductor materials as the layers 24 and 26 which is doped so as to have a very high resistance. The first semiconductor layer 24 has a narrow, shallow groove 28 in its surface adjacent the edge 26*a* of the second semiconductor layer 26 so that the edge 26*a* of the second semiconductor layer 26 forms an extension of one side wall of the groove 28.

A first metal film 30 is on the surface of the first semiconductor layer 24 at the other side of the groove 28 and forms a part of the other side wall of the groove 28. Also, the first metal film edge 30*a* extends inwardly over the groove 28 so as to overhang a portion of the bottom of the groove 28.

A second metal film 32 is on the surface of the second semiconductor layer 26 and is spaced from the edge 26*a* of the second semiconductor layer 26. The first and second metal films 30 and 32 are of any metal which forms a suitable conducting contact with the particular semiconductor material of the first and second semiconductor layers 24 and 26. If the concentration of the conductivity modifier in the lower resistance second semiconductor layer 26 is sufficiently high, almost any metal which adheres to the surface can be employed for the second metal film 32 since the current can be transmitted between the metal and the semiconductor by tunneling. The constraints on the metal for contacting the first semiconductor layer 24 are also very mild since under normal operating bias conditions, carriers are injected from the semiconductor material into the metal contact. Thus, metals which normally form either ohmic contacts or rectifying Schottky barrier contacts are acceptable for both the first and second metal films 30 and 32.

A masking layer 34 is on the surface of the second semiconductor layer 26 between the second metal film 32 and the edge 26*a* of the second semiconductor layer 26. The masking layer 34 extends beyond the second semiconductor layer edge 26*a* so as to overhang the groove 28 in cantilever fashion. Thus, the edge 34*a* of the masking layer 34 is slightly spaced from the top of the edge 30*a* of the first metal film 30*a*. The masking layer 34 may be of any material which can be etched by an etchant which does not attack the materials of the other elements of the device and which is not attacked by etchants for the other materials. Thus, the masking layer 34 may be a metal or an insulating material, such as silicon dioxide, silicon nitride or aluminum oxide. For ease of description, the masking layer 34 is shown and will be described as an insulating material.

A third metal film 36 is on the first semiconductor layer 24 at the bottom of the groove 28. The third metal film 36 is of a width substantially equal to the space between the edge 34*a* of the insulating masking layer 34 and the top of the edge 30*a* of the first metal film 30. Thus, the edges of the third metal film 36 are in substantially transverse alignment with the insulating masking layer edge 34*a* and the top of the first metal film edge 30*a* respectively. The third metal film 36 is of a thickness such that the top surface thereof is in closely spaced relation to the insulating masking layer 34 and the first metal film 30. The third metal film 36 is of a metal which forms a Schottky surface barrier junction with the particular semiconductor material of the first semiconductor layer 24. For example, gold-zinc, may be used on germanium, or platinum silicide on silicon, or nickel or gallium-gold alloy on gallium arsenide. A metal film 38 is coated on the second metal film 32 and the insulating masking layer 34, and a metal film 40 is coated on the first metal film 30. For reasons which will be explained later, the metal films 38 and 40 are of the same metal as the third metal film 36.

In the field effect transistor 20, the second semiconductor layer 26 and its overlying metal films 32 and 38 can serve as the source of the transistor. The first metal film 30 and its overlying metal film 40 can serve as the drain of the transistor. The third metal film 36 serves as the gate of the transistor which is a junction type gate. As previously described, the side edges of the gate 36 are in closely spaced relation to the source and drain contacts. As will be explained later, the gate 36 can be easily made very narrow, as narrow as less than 1.5 microns. Although the transistor 20 has been described as having a junction type gate, it can have an insulated gate by providing a layer of an insulating material, such as silicon dioxide, on the bottom of the groove 28 beneath the third metal film 36.

Figure 2A:
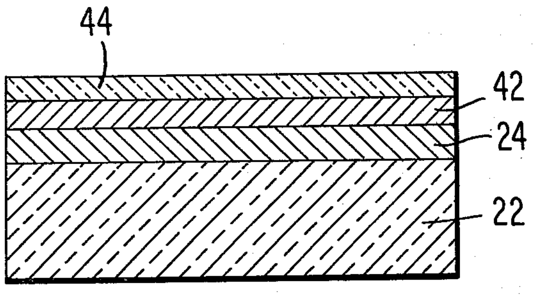
FIGS. 2*a*–2*f* are sectional views showing the various steps of making the semiconductor device shown in FIG. 1 in accordance with the method of the present invention.
Figure 2D:
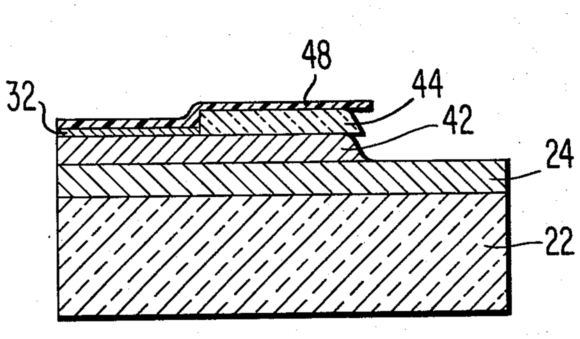
Figure 2B:
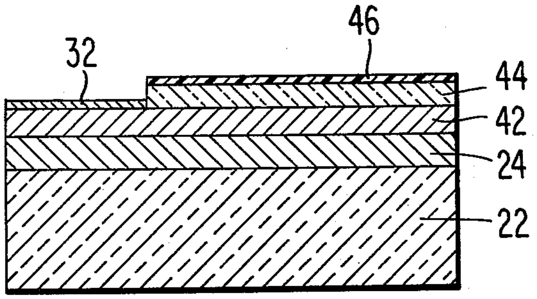

To make the transistor 20, the first semiconductor layer 24 is formed on a surface of the substrate 22 (See FIG. 2*a*). A layer 42 of the low resistance semiconductor material from which the second semiconductor layer 26 is to be formed is then disposed on the entire surface of the first semiconductor layer 24. The semiconductor layers may be individually epitaxially deposited in succession on the substrate 22. Alternately, a single epitaxial layer of the resistance of the first semiconductor layer 24 but of a thickness equal to the combined thicknesses of the two semiconductor layers may be deposited on the substrate, and a dopant diffused into the epitaxial layer to form the second layer 42 over the first layer 24. Also, if the substrate 22 is of a semiconductor material, the two layers 24 and 42 may be formed by successive diffusions. A layer 44 of the insulating material of the insulating masking layer 34 is then deposited over the entire surface of the semiconductor layer 42. As shown in FIG. 2*b*, a masking layer 46 of a resist material is coated on the insulating layer 44 except for the area where the second metal film 32 is to be provided using standard photolithographic techniques. The uncovered portion of the insulating layer 44 is then removed, such as by etching with an etchant suitable for the particular insulating material used. This exposes a portion of the surface of the semiconductor layer 42 which is then coated with the second metal film 32. The second metal film 32 can be coated on the exposed surface of the semiconductor layer 42 by any well known technique for applying the particular metal used, such as by vacuum evaporation. The masking layer 46 is then removed with a suitable solvent.

Figure 2E:
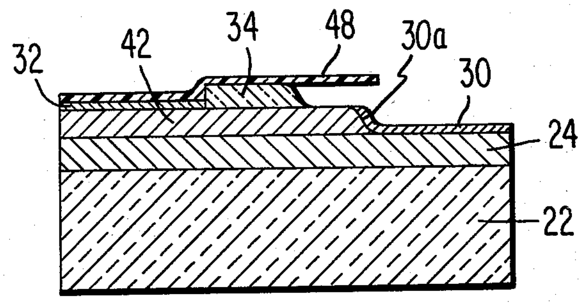
Figure 2C:
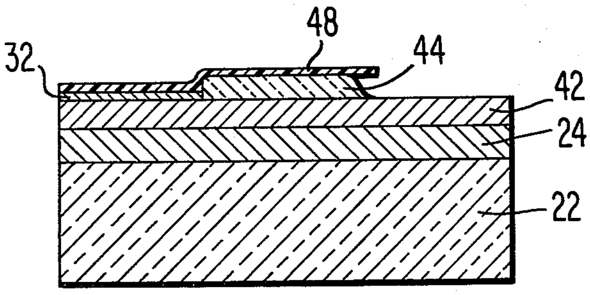

A new masking layer 48 of a resist material is then coated on the second metal film 32 and the insulating layer 44 except where the first metal film 30 is to be provided using standard photolithographic techniques (See FIG. 2*c*). The exposed portion of the insulating layer 44 is then removed, such as by etching with a suitable etchant for the particular insulating material used. As shown in FIG. 2*c*, the etching away of the exposed portion of the insulating layer 44 removes some of the insulating layer from under the edge of the masking layer 48. Thus, the area of the exposed portion of the insulating layer 44 should be slightly smaller than the desired area for the first metal film 30. The removal of the portion of the insulating layer 44 exposes a portion of the semiconductor layer 42. As shown in FIG. 2*d*, the exposed portion of the semiconductor layer 42 is then removed, such as by etching with a suitable etchant for the particular semiconductor material used. This exposes a portion of the first semiconductor layer 24 which is then coated with the first metal film 30. The first metal film 30 is also coated onto the exposed end of the semiconductor layer 42 so as to form the edge 30*a* of the first metal film (See FIG. 2*e*). The first metal film 30 may be coated on the semiconductor layers 24 and 42 by any well known technique for applying the particular metal used for the second metal film 32. However, the well known technique of electroless plating is preferred.

Figure 2F:
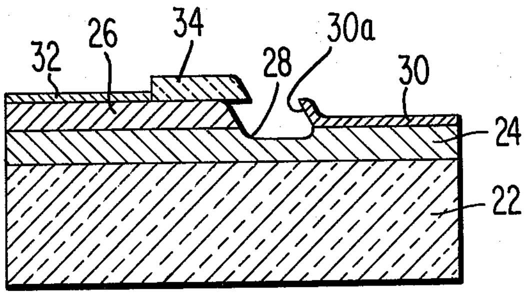

As shown in FIG. 2*e*, the insulating layer 44 is then again etched away further from under the masking layer 48 to expose another portion of the surface of the semiconductor layer 42. The additional amount of the insulating layer 44 which is etched away is such that the width of the exposed surface of the semiconductor layer 42 is equal to the desired width of the gate metal film 36. Since the etching rate to etch away various insulating materials is known, the amount of the insulating material removed can be easily controlled to a high degree of accuracy to expose very narrow widths, less than about 1.5 microns, of the semiconductor layer 42. The remaining portion of the insulating layer 44 on the insulating layer 42 is the insulating masking layer 34 of the transistor 20. The masking layer 48 is then removed with a suitable solvent. The exposed portion of the semiconductor layer 42 is then etched away with a suitable etchant for the particular semiconductor material used. The etching is carried out for a period long enough to etch through the semiconductor layer 42 and slightly into the first semiconductor layer 24 to form the groove 28 (See FIG. 2*f*). During the etching operation, the semiconductor material is not only etched away perpendicularly to the surface of the semiconductor layer 42 but also slightly along the surface. Thus, some of the semiconductor layer 42 is removed from under the edge of the insulating masking layer 34 leaving the edge of the insulating masking layer 34 overhanging the groove 28 in cantilever fashion. The etching of the groove 28 also forms the second semiconductor layer 26 of the transistor 20.

The third metal film 36 is then coated on the bottom of the groove 28. This is achieved by the well known process of evaporation in a vacuum wherein a source of the metal of the metal film 36 and the semiconductor device 20 are placed in a chamber which is evacuated. The source of the metal is heated to a temperature at which the metal evaporates and the metal vapors are condensed on the bottom surface of the groove 28 to form the third metal film 36. The source of the metal is positioned substantially directly over the groove 28 so that the overhanging edges 34*a* and 30*a* of the insulating masking layer 34 and the first metal film 30, respectively, shadow mask the sides of the groove 28 from the metal vapors. Thus, the metal vapors condense only on the bottom surface of the groove 18 between the edge 34*a* of the insulating masking layer 34 and the top of the edge 30*a* of the first metal layer 30 so that the edges of the third metal film 36 are in transverse alignment with the insulating masking layer edge 34*a* and the top of the first metal film edge 30*a* respectively. The metal vapors also deposit on the second metal film 32 and the insulating masking layer 34 to form the metal film 38 and on the first metal film 30 to form the metal film 40.

Thus, in the method of the present invention, the width of the third metal film 36, the gate of the transistor 20, is not defined by a photolithographic process including the use of photomasks, but is determined by the etching of a masking layer. Since a relatively slow etchant having a known etching rate can be used, the amount of the masking layer removed can be accurately controlled so that the width of the semiconductor layer 42 exposed, which determines the width of the third metal film 36, can be made very narrow, as narrow as a fraction of 1 micron. Thus, extremely narrow third metal films 36 can be achieved by the method of the present invention. In addition, the method of the present invention utilizes the shadow masking technique in depositing the third metal film 36 so that the edges of the third metal film are in very close relation to first metal film 30 and the metal film 38 which extends over the first metal film 32. Also, as can be seen in FIGS. 2*d* and 2*e*, the shape of the edge of the resist masking layer 48 defines the shape of both the edge 30*a* of the first metal film and the edge 34*a* of the masking layer 34. Thus, these edges are parallel in that they follow the same exact path even though the path may not be straight but may have wiggles therein. Since the first metal film edge 30*a* and the masking layer edge 34*a* define the shape of the sides of the third metal film 36, the sides of the third metal film 36 are also parallel. Thus, the third metal film 36 is of uniform width along its entire length even though it may not be straight but may have wiggles therein. The combination of these three features provides a field effect transistor having a very narrow gate of uniform width which is in very close relation to the source and drain so as to have good electrical characteristics and which is capable of operating at high frequencies.

Figure 3:
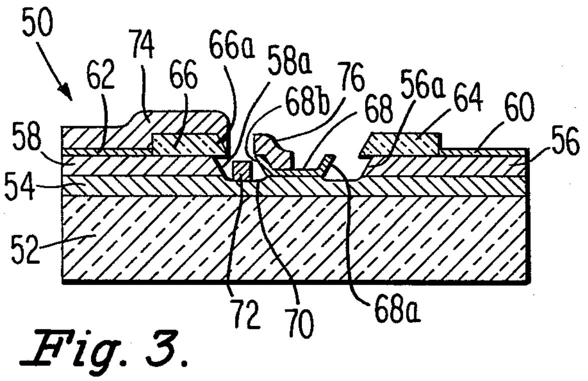
FIG. 3 is a sectional view of a second form of the semiconductor device of the present invention.

Referring to FIG. 3, a second form of the semiconductor device of the present invention, generally designated as 50, is a double gate field effect transistor have Schottky surface barrier junction gates. The transistor 50 comprises a flat substrate 52 of an electrically insulating or semi-insulating material having on a surface thereof a first layer 54 of a semiconductor material of one conductivity type, either P type or N type. Second and third layers 56 and 58 respectively are in spaced relation on the first layer 54. The second and third layers 56 and 58 are each of the same semiconductor material and conductivity type as the first layer 54 but contain a higher concentration of the particular conductivity modifier so as to be of a lower resistance than the first layer 54. The second and third semiconductor layers 56 and 58 have opposed spaced edges 56*a* and 58*a* respectively.

A first metal film 60 is on the second semiconductor layer 56 and is spaced from the edge 56*a* of the second semiconductor layer. A second metal film 62 is on the third semiconductor layer 58 and is spaced from the edge 58*a* of the third semiconductor layer. A first masking layer 64 of an electrical insulating material is on the second semiconductor layer 56 between the first metal film 60 and the edge 56*a* of the second semiconductor layer. A second masking layer 66 of an electrical insulating material is on the third semiconductor layer 58 between the second metal film 62 and the edge 58*a* of the third semiconductor layer. The first and second insulating masking layers 64 and 66 project beyond the edges 56*a* and 58*a* of the second and third semiconductor layers 56 and 58 respectively so as to overhang the first semiconductor layer 54 in cantilever fashion. The masking layers 64 and 66 may be of a metal or any other material having the properties described for the masking layer 34 of the transistor 20 shown in FIG. 1.

A third metal film 68 is on the first semiconductor layer 54 between the second and third semiconductor layers 56 and 58. The third metal film 68 has thicker end portions so as to provide relatively high end surfaces 68*a* and 68*b* which face the end surfaces 56*a* and 58*a* of the second and third semiconductor layers 56 and 58 respectively. The end surface 68*b* of the third metal film 68 tapers toward the third semiconductor layer end surface 58*a* so that the third metal film end surface 68*b* overhangs the surface of the first semiconductor layer 54 between the third metal film 68 and the third semiconductor layer 58. Also, the top of the end surface 68*b* of the third metal film 68 is in closely spaced relation to the overhanging end 66*a* of the second insulating layer 66, preferably less than 1.5 microns. The third metal film 68 is of a metal which forms a Schottky surface barrier junction with the semiconductor material of the first semiconductor layer 54.

A shallow groove 70 is in the surface of the first semiconductor layer 54 between the third metal film 68 and the third semiconductor layer 58. The third semiconductor layer end surface 58*a* and the end surface 68*b* of the third metal film 68 form extensions of the respective sides of the shallow groove 70. A fourth metal film 72 is on the first semiconducting layer 54 at the bottom of the groove 70. The fourth metal film 72 is of a width substantially equal to the space between the edge 66*a* of the second insulating masking layer 66 and the top of the end surface 68*b* of the third metal film 68. Thus, the edges of the fourth metal film 72 are in substantially transverse alignment with the second insulating masking layer edge 66*a* and the top of the third metal film end surface 68*b* respectively. The fourth metal film 72 is of a thickness such that the top surface thereof is in closely spaced relation to the second insulating masking layer 66 and the third metal film 68. The fourth metal film 72 is of a metal which forms a Schottky surface barrier junction with the first semiconductor layer 54. A metal film 74 is coated on the second metal film 62 and the second insulating layer 66, and a metal film 76 is coated on a portion of the third metal film 68. The metal films 74 and 76 are of the same metal as the fourth film 72.

In the field effect transistor 50, the third semiconductor layer 58 and its overlying metal films 62 and 74 can serve as the source of the transistor. The second semiconductor layer 58 and its overlying metal film 60 serve as the drain of the transistor. The third metal film 68 and fourth metal film 72 serve as gates of the transistor which are junction type gates. This provides a four terminal, double gate field effect transistor. In the transistor 50, the gate 72 is in close relation to the source, can be made very narrow, as small as less than 1.5 microns, and is of uniform width along its entire length.

Figure 4D:
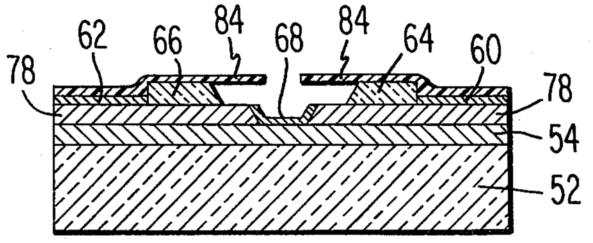
FIGS. 4*a*–4*g* are sectional views showing the various steps of making the semiconductor device shown in FIG. 3 in accordance with the method of the present invention.
Figure 4A:
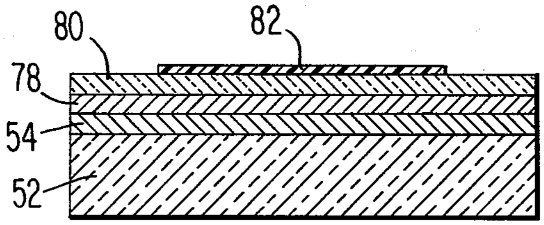

To make the transistor 50, the first semiconductor layer 54 may be epitaxially deposited on a surface of the substrate 52 (See FIG. 4*a*). A layer 78 of the low resistance semiconductor material of the second and third semiconductor layers 56 and 58 is then epitaxially deposited on the entire surface of the first semiconductor layer 54. However as previously described with regard to the transistor 20 shown in FIG. 1, the semiconductor layers 54 and 78 may be formed by a single epitaxial deposition and diffusion or by two diffusion steps. A layer 80 of the material of the masking layers 64 and 66, shown as an insulating material, is then deposited over the entire surface of the semiconductor layer 78. A masking layer 82 of a resist material is coated on the insulating layer 80 except for the areas where the first and second metal films 60 and 62 are to be provided using standard photolithographic techniques. As shown in FIG. 4*b*, the uncovered portions of the insulating layer 80 are then removed, such as by an etchant suitable for the particular material used. This exposes portions of the semiconductor layer 78 which are then coated with the first and second metal films 60 and 62, such as by electroless plating. The masking layer 82 is then removed with a suitable solvent.

Figure 4E:
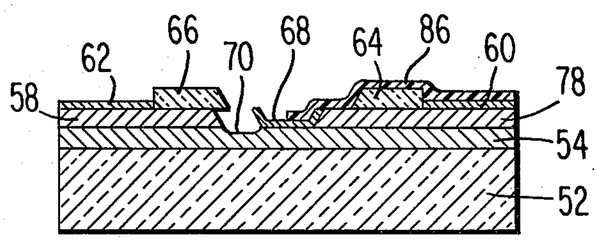
Figure 4B:
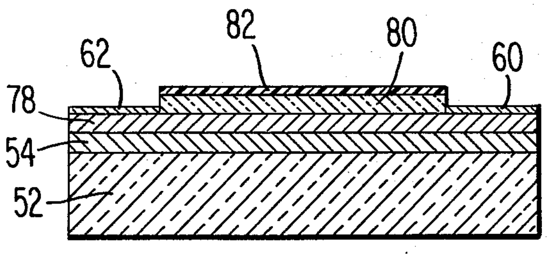
Figure 4F:
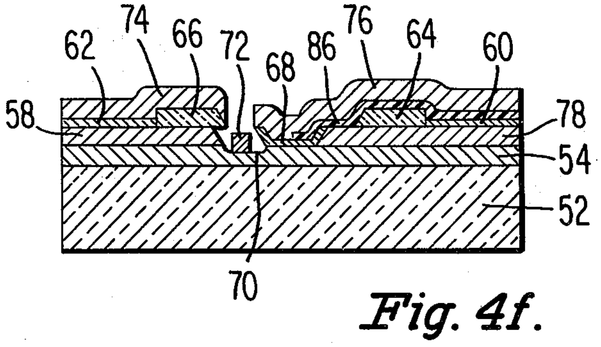
Figure 4C:
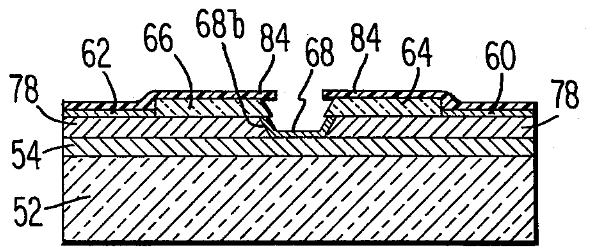

As shown in FIG. 4*c*, a masking layer 84 of a resist material is then coated over the first and second metal films 60 and 62 and the insulating layer 80 except where the third metal film 68 is to be provided using standard photolithographic techniques. The exposed portion of the insulating layer 80 is then removed with a suitable etchant to expose the surface of the semiconductor layer 78. The exposed portion of the semiconductor layer 78 is then removed with a suitable etchant to expose the surface of the first semiconductor layer 54. The third metal film 68 is then coated on the exposed surface of the first semiconductor layer 54 and the adjacent edges of the semiconductor layer 78. The portions of the third metal film 68 which are coated on the edges of the semiconductor layer 78 form the thicker edge portions of the third metal film. Also, when the portion of the semiconductor layer 78 is etched away, portions of the semiconductor layer 78 are etched away from under the edges of the insulating layer 80 to provide the semiconductor layer 78 with tapered edges. This provides the third metal film 68 with the tapered edge surface 68*b*.

As shown in FIG. 4*d*, the exposed edges of the insulating layer 80 are then again etched away further from under the masking layer 84 to expose additional portions of the surface of the semiconductor layer 78 on each side of the third metal film 68. The additional amount of the insulating layer 80 which is etched away is such that the width of each of the exposed surface portions of the semiconductor layer 78 is equal to the desired width of the fourth metal film 72. The remaining portions of the insulating layer 80 on the semiconductor layer 78 are the first and second insulating masking layers 64 and 66 of the transistor 50. The masking layer 84 is then removed with a suitable solvent.

Using standard photolithographic techniques, a masking layer 86 of a resist material is then coated over the first metal film 60, the first insulating masking layer 64, the exposed portion of the surface of the semiconductor layer 78 adjacent the first insulating masking layer 64, and a portion of the third metal film 68 as shown in FIG. 4*e*. The exposed portion of the semiconductor layer 78 between the third metal film 68 and the second insulating masking layer 66 is then removed with a suitable etchant. Some of the semiconductor material will be etched away from under the second insulating masking layer 66 so as to provide the overhanging edge of the second insulating masking layer 66. This exposes the surface of the first semiconductor layer 54, and the shallow groove 70 is then etched in the first semiconductor layer 54. The etching away of the semiconductor layer 78 forms the third semiconductor layer 58. The fourth metal film 72 is then coated on the bottom of the groove 70. This is achieved by the process of evaporation in a vacuum as previously described with regard to the forming of the gate 36 of the transistor 20 shown in FIG. 1. During the depositing of the fourth metal film 72 on the bottom of the groove 70, the edges of the third metal film 68 and the second insulating masking layer 66 shadow mask the groove so that the fourth metal film 72 is deposited only across the space between such edges. As shown in FIG. 4*f*, during the deposition of the fourth metal film 72, the metal film 74 is coated on the second metal film 62 and the second insulating layer 66, and the metal film 76 is coated on a portion of the third metal film 68 and on the masking layer 86. The masking layer 86 is then removed with a suitable solvent. This also removes the portion of the metal film 76 on the masking layer 86 leaving the metal film 76 only on a portion of the third metal film 68.

Figure 4G:
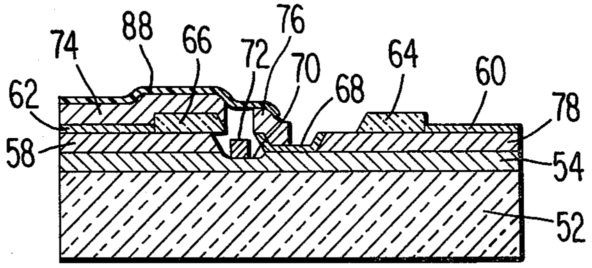

As shown in FIG. 4*g*, a masking layer 88 of a resist material is coated over the metal film 74, the fourth metal film 72, and the metal film 76. The exposed portion of the semiconductor layer 78 between the third metal film 68 and first insulating masking layer 64 is then removed with a suitable etchant. This forms the second semiconductor layer 56 as shown in FIG. 3. The masking layer 88 is then removed with a suitable solvent to complete the making of the transistor 50.

Figure 5:
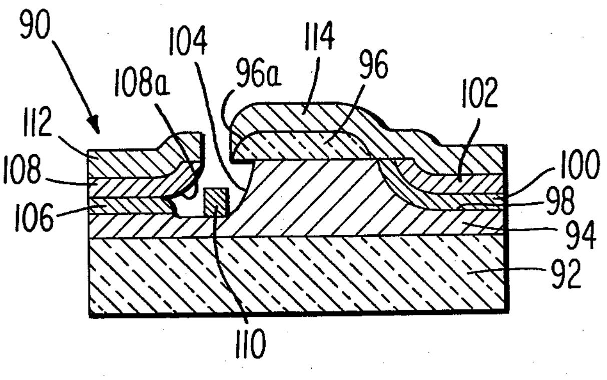
FIG. 5 is a sectional view of a third form of the semiconductor device of the present invention.

Referring to FIG. 5, a third form of the semiconductor device of the present invention is generally designated as 90. The semiconductor device 90 is a three terminal field effect transistor having a gate-to-drain spacing which is greater than the source-to-gate spacing. This type of spacing provides the transistor 90 with increased voltage gain and power. Transistor 90 comprises a flat substrate 92 of an electrical insulating or semi-insulating material having on a surface thereof a layer 94 of a semiconductor material of either conductivity type. On a portion of the surface of the first semiconductor layer 94 is a masking layer 96 of an electrical insulating material. The first semiconductor layer 94 has a pocket 98 in its surface juxaposed to one edge of the insulating layer 96. The surface of the pocket 98 is coated with a second layer 100 of a semiconductor material of the same conductivity type as that of the first semiconductor layer 94 but of lower resistance. The second semiconductor layer 100 is coated with a metal film 102 of a metal which forms an ohmic contact to the second semiconductor layer 100.

The first semiconductor layer 94 has a groove 104 in its surface juxaposed to the other edge 96*a* of the insulating layer 96. The groove 104 extends under the insulating masking layer edge 96*a* so that the masking layer extends over the groove in cantilever fashion. The first semiconductor layer 94 is thinner at the side of the groove 104 away from the insulating masking layer 96 than it is under the insulating masking layer 96. A third layer 106 of a semiconductor material is on the surface of the thinner portion of the first semiconductor layer 94. The third semiconductor layer 106 is of the same conductivity type as the first semiconductor layer 94, but of higher conductivity. A second metal film 108 is on the third semiconductor layer 106 and is in ohmic contact with the third semiconductor layer. The second metal film 108 is thicker at the side of the groove 104 so that the edge 108*a* of the second metal film forms an extension of the side of the groove 104. The second metal film edge 108*a* is tapered to extend toward the edge 96*a* of the insulating masking layer 96 so that the top of the second metal film edge is in closely spaced relation to the insulating masking layer edge 96*a*. Also, the second metal film edge 108*a* overhangs a portion of the groove 104 in cantilever fashion.

A third metal film 110 is on the first semiconductor layer 94 at the bottom of the groove 104. The third metal film 110 is of a width substantially equal to the space between the edge 96*a* of the insulating masking layer 96 and the top of the edge 108*a* of the second metal film 108. Thus, the edges of the third metal film 110 are in substantially transverse alignment with the insulating masking layer edge 96*a* and the top of the second metal film edge 108*a* respectively. The third metal film 110 is of a thickness such that the top surface thereof is in closely spaced relation to the insulating layer 96 and the second metal film 108. The third metal film 110 is of a metal which forms a Schottky surface barrier junction with the first semiconductor layer 94. A metal film 112 is coated on the second metal film 108, and a metal film 114 is coated on the insulating layer 96 and the first metal film 102. The metal films 112 and 114 are of the same metal as the third metal film 110.

In the field effect transistor 90, the highly conductive third semiconductor layer 106 and its overlying metal film 108 and 112 serve as the source of the transistor. The highly conductive second semiconductor layer 100 and its overlying metal film 102 and 114 serve as the drain of the transistor. The third metal film 110 serves as the gate of the transistor which is a junction type gate. As can be seen, the gate-to-source spacing is very small whereas the gate-to-drain spacing is much larger. As in the previously described forms of the semiconductor device of the present invention, the width of the gate 110 can be made very narrow, as narrow as less than 1.5 microns, and the gate 110 is of uniform thickness along its entire length.

Figure 6A:
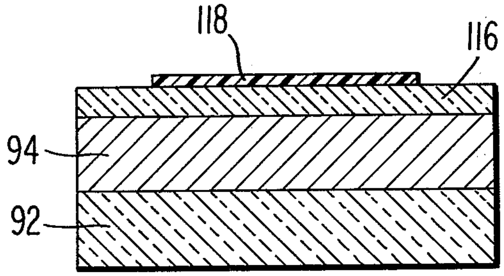
FIGS. 6*a*–6*f* are sectional views showing the various steps of making the semiconductor device shown in FIG. 5 in accordance with the method of the present invention.
Figure 6D:
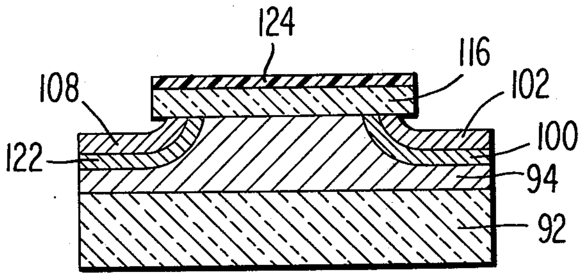
Figure 6B:
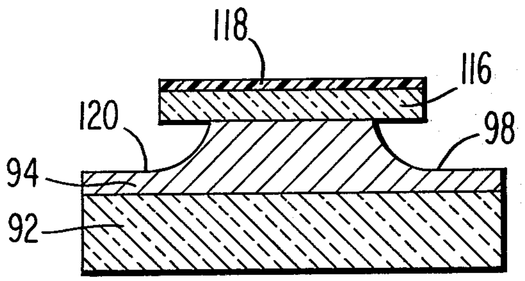

To make the transistor 90, the first semiconductor layer 94 is epitaxially deposited on a surface of the substrate 92 (See FIG. 6*a*). A layer 116 of an electrically insulating material is deposited over the entire surface of the first semiconductor layer 94. Using standard photolithographic techniques, a masking layer 118 of a resist material is coated on the surface of the insulating layer 116 except the areas where the first and second metal films 102 and 108 are to be provided. The exposed portions of the insulating layer 116 are then removed, such as with a suitable etchant, to expose areas of the surface of the first semiconductor layer 94. As shown in FIG. 6*b*, portions of the exposed areas of the first semiconductor layer 94 are then removed, such as with a suitable etchant, to form the pocket 98 at one side of the insulating layer 116 and a second pocket 120 at the other side of the insulating layer 116. The first semiconductor layer 94 is etched so that the pockets 98 and 120 extend under the edges of the insulating layer 116. The masking layer 118 is then removed with a suitable solvent.

The surfaces of the pockets 100 and 120 are then coated with the same semiconductor material as that of the first semiconductor layer 94 but of a higher conductivity by either epitaxial deposition or diffusion. This forms the second semiconductor layer 100 on the surface of the pocket 98, and a semiconductor layer 122 on the surface of the pocket 120 as shown in FIG. 6*c*. As shown in FIG. 6*d*, a masking layer 124 of a resist material is applied to the insulating layer 116 using standard photolithographic techniques. The semiconductor layers 100 and 122 are each then coated with a metal film which forms an ohmic contact therewith. This forms the first metal film 102 on the second semiconductor layer 100, and the second metal film 108 on the semiconductor layer 122. The metal films 102 and 108 are preferably applied by electroless plating.

Figure 6E:
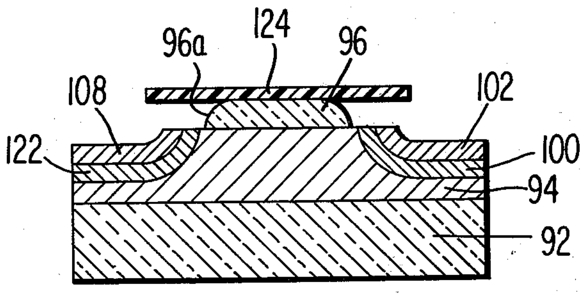
Figure 6C:
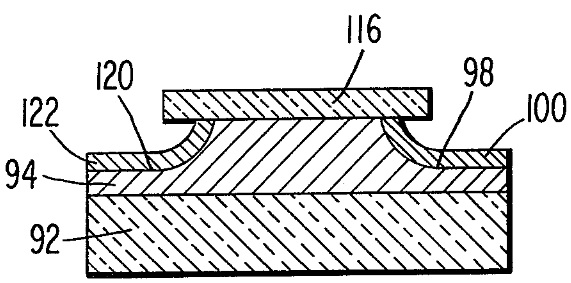

As shown in FIG. 6*e*, the edges of the insulating layer 116 are then removed from under the masking layer 124 using a suitable etchant. This forms the insulating masking layer 96 having an edge 96*a* which is spaced from the second metal film 108 a distance equal to the desired width for the third metal film 110. This also exposes the end of the semiconductor layer 122, and possibly a portion of the surface of the first semiconductor layer 94. The masking layer 124 is then removed with a suitable solvent.

Figure 6F:
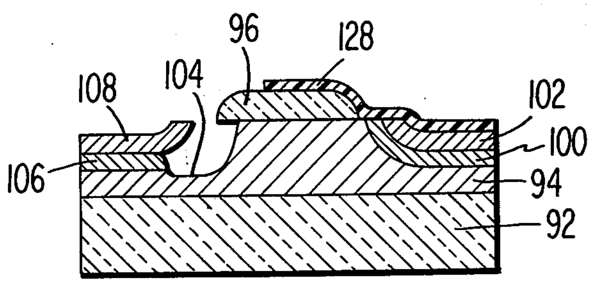

As shown in FIG. 6*f*, a masking layer 128 of a resist material is then applied over the first metal film 102 and a portion of the insulating masking layer 96 using standard photolithographic techniques. The portion of the semiconductor layer 122 and the first semiconductor layer 94 exposed between the insulating masking layer 96 and second metal film 108 is then removed with a suitable etchant to form the groove 104. Enough of the semiconductor material is etched away so that groove 104 extends under the insulating masking layer 96 and under second metal film 108. Thus, the edges of the insulating masking layer 96 and second metal film 108 extend over the groove 104 in cantilever fashion. Also, this forms the third semiconductor layer 106 between the second metal film 108 and first semiconductor layer 94. The masking layer 128 is then removed with a suitable solvent.

The third metal film 110 is then coated on the bottom of the groove 104. This is achieved by the process evaporation in a vacuum as previously described with regard to the forming of the gate 36 of the transistor 20 shown in FIG. 1. During the deposition of the third metal film 110 on the bottom of the groove 104 the edges of the second metal film 108 and the insulating masking layer 96 shadow mask the groove so that the third metal film 110 is deposited only across the space between such edges. During the deposition of the third metal film 110, the metal film 112 is coated on the second metal film 108 and the metal film 114 is coated on the insulating layer 96 and the first metal film 102.

Figure 7:
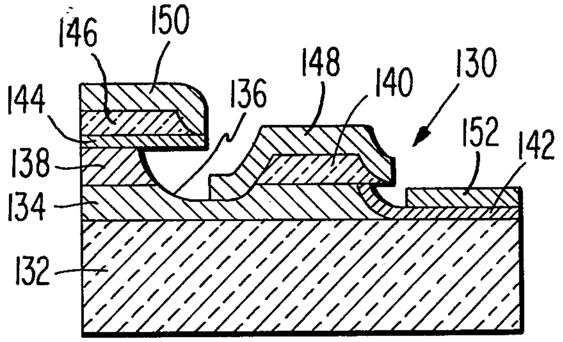
FIG. 7 is a sectional view of a fourth form of the semiconductor device of the present invention.

Referring to FIG. 7, a fourth form of the semiconductor device of the present invention is generally designated as 130. The semiconductor device 130 is a field effect transistor having a junction type gate with the gate junction being narrow to permit high frequency operation of the transistor but the width of the gate being relatively wide so that the gate has a low resistance. Also, the transistor 130 has a gate-to-drain spacing which is greater than the source-to-gate spacing. The transistor 130 comprises a flat substrate 132 of an electrical insulating or semi-insulating material. A first layer 134 of a semiconductor material of either conductivity type is on a portion of a surface of the substrate 132. The first semiconductor layer 134 has a shallow groove 136 therein spaced from the edges of the first semiconductor layer. A second layer 138 of a semiconductor material of the same conductivity type as that of the first semiconductor layer 134 but of lower resistance is on the first semiconductor layer 134 at one side of the groove 136. The second semiconductor layer 138 extends to one side of the groove 136 so that the edge of the second semiconductor layer forms an extension of the side of the groove.

A first masking layer 140 of a transparent electrical insulating material is on the first semiconductor layer 134 at the other side of the groove 136. The first masking insulating layer 140 extends to the other side of the groove 136 so that an edge of the first masking insulating layer forms an extension of the other side of the groove. The other edge of the first masking insulating layer 140 projects beyond the edge of the first semiconductor layer 134 so as to overhang in cantilever fashion a portion of the substrate 132 not coated with first semiconductor layer 134. A first metal film 142 is on the surface of the substrate 132 not coated with the first semiconductor layer 134. The first metal film 142 extends under the overhanging edge of the first masking insulating layer 140 and over the edge of the first semiconductor layer 134.

A second metal film 144 is on the second semiconductor layer 138. The second metal film 144 extends beyond the edge of the second semiconductor layer 138 and overhangs a portion of the groove 136 in cantilever fashion. A second layer 146 of an electrical insulating material is on the second metal film 144 but is spaced from the edge of the edge of the second metal film which overhangs the groove 136.

A third metal film 148 is on the first semiconductor layer 134 at the bottom of the groove 136. The third metal film 148 is on the portion of the bottom of the groove 136 which is not covered by the second metal film 144 so that an edge of the third metal film 148 is in substantially transverse alignment with the edge of the second metal film 144. The third metal film 148 also extends along a side of the groove 136 and over the first masking insulating layer 140. The third metal film 148 is of a metal which forms Schottky barrier junction with the first semiconductor layer 134. A metal film 150 is on the second insulating layer 146 and the uncovered portion of the second metal film 144, and a metal film 152 is on a portion of the first metal film 142. The metal films 150 and 152 are of the same metal as that of the third metal film 148.

In the transistor 130, the first metal film 142 serves as the drain, the second semiconductor layer 138 and the overlying second metal film 144 serve as the source, and the third metal film 148 serves as the gate. The gate 148 is a junction type gate with the active portion of the gate being only along the portion of the gate which contacts the first semiconductor layer 134. This junction can be made very narrow, as narrow as less than 1.5 microns, so as to permit the transistor 130 to operate at high frequencies. However, the gate 148 is relatively wide so as to have a low resistance which permits the transistor 130 to operate at high power.

Figure 8D:
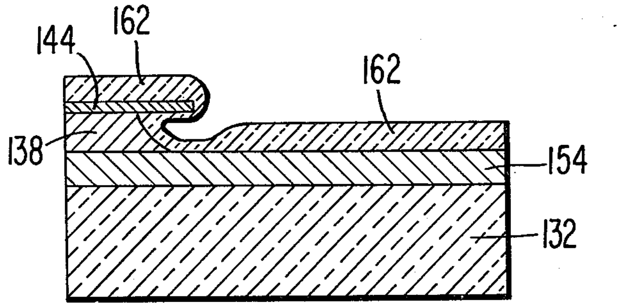
FIGS. 8*a*–8*j* are sectional views showing the various steps of making the semiconductor device shown in FIG. 7 in accordance with the method of the present invention.
Figure 8A:
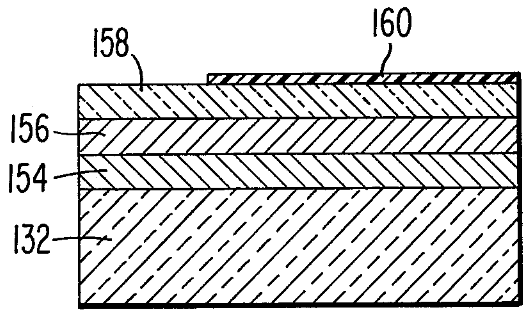
Figure 8E:
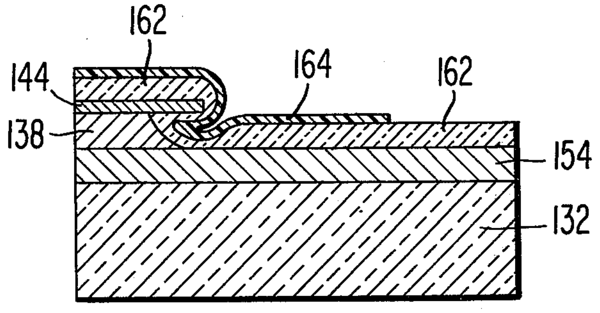
Figure 8B:
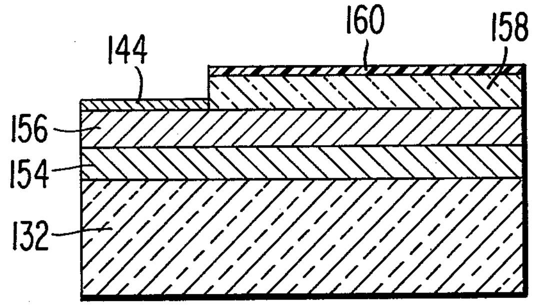

To make the transistor 130, a layer 154 of a semiconductor material of the conductivity type desired for the first semiconductor layer 134 may be epitaxially deposited on the entire surface of a substrate 132 (See FIG. 8*a*). A layer 156 of a semiconductor material of the conductivity type desired for the second semiconductor layer 138 is then epitaxially deposited over the entire surface of the semiconductor layer 154. However, as previously described with regard to the transistor 20 shown in FIG. 1, the semiconductor layers 154 and 156 may be formed by a single epitaxial deposition and diffusion or by two diffusion steps. A layer 158 of an electrically insulating material is then deposited over the entire surface of the semiconductor layer 156. Using standard photolithographic techniques a masking layer 160 of a resist material is then applied to the surface of the insulating layer 158 except where the second metal film 144 is to be provided. As shown in FIG. 8*b*, the uncovered portion of the insulating layer 158 is then removed using a suitable etchant to expose a portion of the semiconductor layer 156. The exposed surface of the semiconductor layer 156 is then coated with the second metal film 144, such as by electroless plating or vacuum evaporation. The masking layer 160 is then removed with a suitable solvent.

Figure 8F:
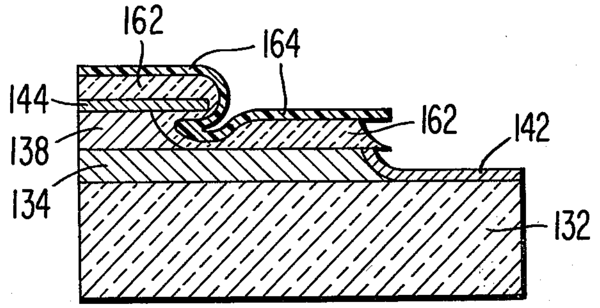
Figure 8C:
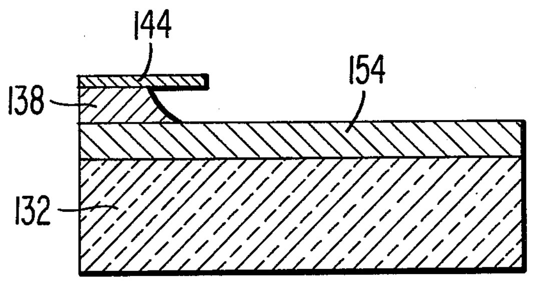

As shown in FIG. 8*c*, the remaining portion of the insulating layer 158 is then removed with a suitable etchant to expose the surface of the semiconductor layer 156 which is not coated with the second metal film 144. The exposed portion of the semiconductor layer 156 is then removed with a suitable etchant. A portion of the semiconductor layer 156 is also removed from under the edge of the second metal film 144 so that the remaining portion of the semiconductor layer forms the second semiconductor layer 138.

As shown in FIG. 8*d*, a layer 162 of a transparent electrical insulating material is then deposited on the second metal film 144 and the exposed surface of the semiconductor layer 156. The insulating layer 162 is also deposited under the overhanging edge of the second metal film 144 and on the exposed edge of the second semiconductor layer 138. As shown in FIG. 8*e*, the entire surface of the insulating layer 162 except the area where the first metal film 142 is to be provided is then coated with a masking layer 164 of a positive resist material. A positive resist material is one which sets in the darkness and is made soluble when exposed to the light. By using a positive resist material, the portion of the masking layer 164 which is on the surface of the portion of the insulating layer 162 under the edge of the second metal film 144 will set. As shown in FIG. 8*f*, the exposed portion of the insulating layer 162 is then removed with a suitable etchant to expose a portion of the surface of the semiconductor layer 154. The exposed portion of the semiconductor layer 154 is then removed using a suitable etchant to expose a portion of the surface of the substrate 132. During the etching of the semiconductor layer 154, a portion of the semiconductor layer 154 is removed from under the edge of the insulating layer 162. This forms the first semiconductor layer 134. The first metal film 142 is then coated on the exposed surface of the substrate 132 and the exposed edge of the first semiconductor layer 134 preferably by electroless plating. The masking layer 164 is then removed with a suitable solvent.

Figure 8G:
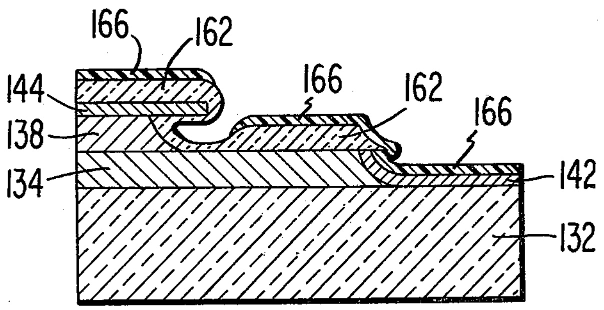
Figure 8H:
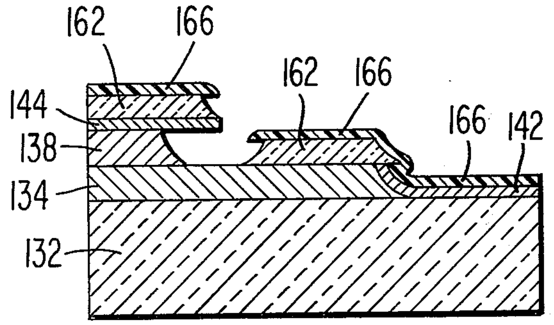

As shown in FIG. 8*g*, a masking layer 166 of a resist material is coated on the surface area of the insulating layer 162 which is not under the second metal film 144, and on the first metal film 144. This is achieved by coating the entire surface of the insulating layer 162 and the first metal film 144 with a negative resist material. A negative resist material is one which is set by being exposed to light. Thus, when a layer of the negative resist material is exposed to light, the portion of the resist layer beneath the edge of the second metal film 144 is not set since it is shadowed from the light by the second metal film 144. This unset portion of the resist layer is then washed away to expose the portion of the insulating layer 162 which is beneath and along the edge of the second metal film 144. The portion of the resist layer 166 on the exposed area of the insulating layer 162 and the first metal film 144 having been exposed to the light is set and remains on the insulating layer and first metal film. As shown in FIG. 8*h* the exposed portion of the insulating layer 162 is then removed with a suitable etchant to expose a portion of the first semiconductor layer 134 and the edge of the second metal film 144.

Figure 8I:
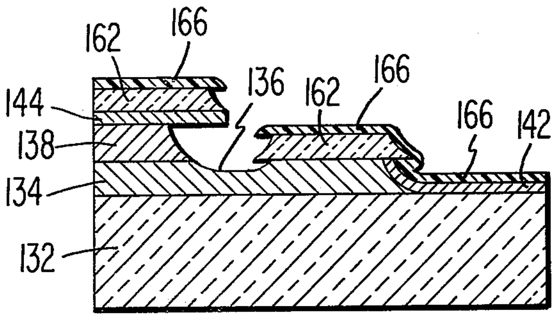
Figure 8J:
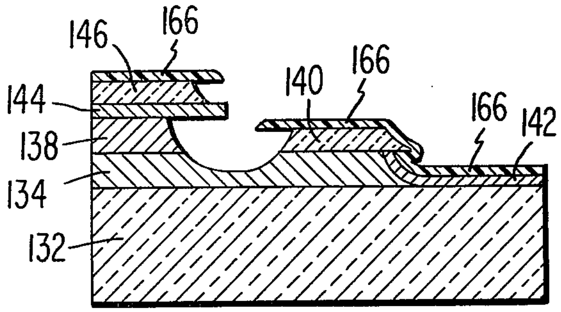

As shown in FIG. 8*i*, a portion of the exposed surface of the first semiconductor layer 134 is then removed with a suitable etchant to form the groove 136. In forming the groove 136, a portion of the first semiconductor layer 134 is etched from under the edge of the portion of the insulating layer which is on the first semiconductor layer. As shown in FIG. 8*j*, the exposed edges of the two portions of the insulating layer are moved with a suitable etchant until the edge of the portion of the insulating layer on the first semiconductor layer 134 forms an extension of one side of the groove 136 and a portion of the surface of the second metal film 144 is exposed. This forms the first insulating masking layer 140 and the second insulating layer 146. The masking layer 166 is then removed with a suitable solvent.

The third metal film 148 is then coated on the bottom of the groove 136 and over the first insulating masking layer 140. This is achieved by the process of evaporation in a vacuum as previously described with regard to the forming of the gate 36 of the transistor 20 shown in FIG. 1. During the deposition of the third metal film 148 on the bottom of the groove 136, the edge of the second metal film 144 shadow masks a portion of the groove so that the third metal film 148 is deposited only on that portion of the groove 136 which is not overhung by the second metal film 144. As previously described, the width of the portion of the groove 136 not overhung by the second metal film 144 is defined by an etching operation so that this width can be made very narrow, as narrow as 1.5 microns. Thus, the active surface barrier junction between the third metal film 148 and first semiconductor layer 134 can be made very small. During the deposition of the third metal film 148, the metal film 150 is deposited on the second insulating layer 146 and a portion of the second metal film, 144, and the metal film 152 is deposited on the first metal film 142.

Figure 9:
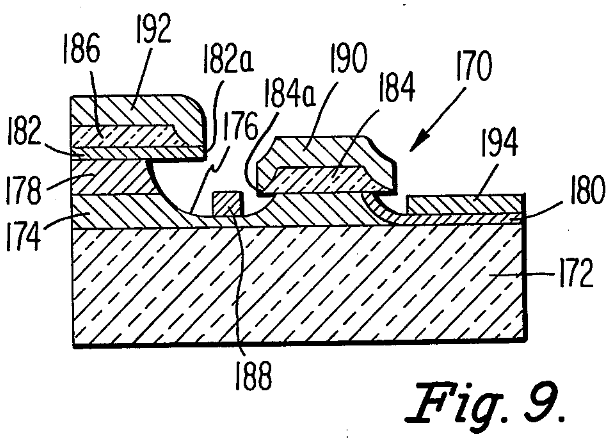
FIG. 9 is a sectional view of a fifth form of the semiconductor device of the present invention.

Referring to FIG. 9, a fifth form of the semiconductor device of the present invention is generally designated as 170. The semiconductor device 170 is a field effect transistor of a construction similar to the field effect transistor 130 shown in FIG. 7 except that it is a four terminal, two gate transistor. One of the gates is a junction type gate, and the other gate is an insulated gate. The transistor 170 comprises a flat substrate 172 of an insulating or semi-insulating material having a first layer 174 of a semiconductor material of either conductivity type on a portion of a surface thereof. The first semiconductor layer 174 has a shallow groove 176 in its surface. A second layer 178 of a semiconductor material of the same conductivity type as that of the first semiconductor layer 174 but of lower resistance is on the surface of the first semiconductor layer 174 at one side of the groove 176. The second semiconductor layer 178 extends to the side of the groove 176 so that the edge of the second semiconductor layer forms an extension of the side of the groove 176.

A first metal film 180 is on the surface of the substrate 172 not covered by the first semiconductor layer 174. The first metal film 180 extends over the edge of the first semiconductor layer 174. A second metal film 182 is on the second semiconductor layer 178 and is of a metal which forms an ohmic contact therewith. The second metal layer 182 projects beyond the edge of the second semiconductor layer 178 so as to overhang a portion of the groove 176 in cantilever fashion. A first masking layer 184 of a transparent electrical insulating material is on the first semiconductor layer 174 between the groove 176 and the first metal layer 180. The edge 184*a* of the first insulating masking layer 184 projects beyond the side of the groove 176 so as to overhang a portion of the groove in cantilever fashion. The edge 184*a* of the first insulating masking layer 184 is spaced laterally a small distance, preferably less than about 1.5 microns, from the edge 182*a* of the second metal film 182. A second layer 186 of an electrical insulating material is on a portion of the second metal film 182.

A third metal film 188 is on the first semiconductor layer 174 in the groove 176. The third metal film 188 is of a width substantially equal to the lateral spacing between the first insulating masking layer edge 184*a* and the second metal film edge 182*a* so that the edges of the third metal film are in substantially transverse alignment with such edges. The third metal film 188 is of a metal which forms a Schottky surface barrier junction with the first semiconductor layer 174. A fourth metal film 190 of the same metal as that of the third metal film 188 is on the first insulating layer 184. A metal film 192 is on the second insulating layer 186 and a portion of the second metal film 182, and a metal film 194 is on a portion of the first metal film 180. The metal film 192 and 194 are of the same metal as that of the third metal film 188.

In the transistor 170, the second semiconductor layer 178 and its overlying metal films serve as the source of the transistor, and the first metal film 180 serves as the drain of the transistor. The third metal film 188 serves as a first gate of the transistor and is a junction type gate. The first metal film 188 can be made very narrow, as narrow as less than 1.5 microns of uniform width along its entire length and is in closely spaced relation with the source of the transistor. The fourth metal film 190 serves as a second gate. Since the fourth metal film 190 is spaced from the first semiconductor layer 174 by the first insulating layer 184, the second gate is an insulated type gate.

Figure 10A:
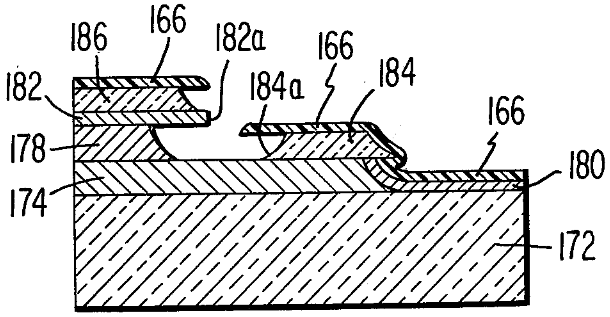
FIGS. 10*a*–10*b* are sectional views showing some of the steps of making the semiconductor device shown in FIG. 9 in accordance with the method of the present invention.
Figure 10B:
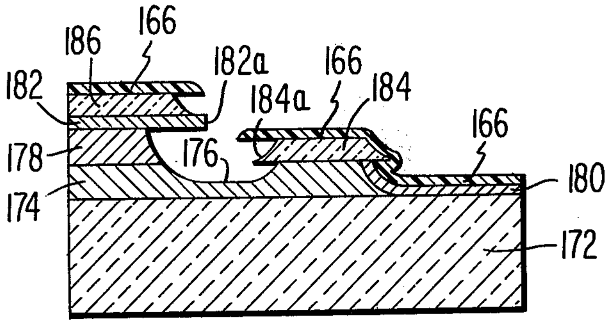

The transistor 170 is made in substantially the same manner as the transistor 130 shown in FIG. 7, in fact, the transistor 170 is made in the same manner as described with regard to and shown in FIGS. 8*a* through 8*g*. However, when the portion of the insulating layer which is not covered by the masking layer 166 and which is under the overhanging edge of the second metal film is removed with a suitable etchant, it is etched back under the edges of the masking layer to form the first insulating masking layer 184 and the second insulating layer 186 as shown in FIG. 10*a*. The insulating layer is etched back under the masking layer 166 a distance such that the edge 184*a* of the first insulating masking layer 184 is laterally spaced from the edge 182*a* of the second metal film 182 a distance equal to the desired width of the fourth metal film 188, a distance preferably less than 1.5 microns. The groove 176 is then etched in the exposed surface of the first semiconductor layer 174 as shown in FIG. 10*b*. The groove 176 is made of a width to extend under the first insulating layer 184 so that the edge 184*a* of the first insulating layer 184 projects over the groove 176 in cantilever fashion. The masking layer 166 is then removed with a suitable solvent.

The third metal film 188 is then coated on the bottom of the groove 176. This is achieved by the process of evaporation in a vacuum as previously described with regard to the forming of the gate 36 of the transistor 20 shown in FIG. 1. During the deposition of the third metal film 188 on the bottom of the groove 176, the overhanging edges 182*a* and 184*a* of the second metal film 182 and the first insulating masking layer 184 respectively shadow mask the groove so that the third metal film 188 is deposited only across the space between such edges. During the deposition of the third metal film 188, the fourth metal film 190 is deposited on the first insulating masking layer 184, and the metal films 192 and 194 are deposited on the second insulating layer 186 and the second metal film 182, and the first metal film 180 respectively.

Thus, there is provided by the present invention a semiconductor device having two or more metal films on a body of a semiconductor material wherein one of the metal films can be made very narrow, widths as narrow as less than 1.5 microns, of uniform width along its entire length and can be positioned in very close but spaced relation to at least one of the other metal films. In the method of the present invention for making the semiconductor device, the widths of the narrow metal film is defined by an etching operation which defines the width of the space in which the film is deposited. The etching operation which defines the width of the space for the narrow metal film is an etching of an edge of a masking layer. This etching can be easily controlled so that a much narrower space can be defined and with greater ease than with previously used photolithographic techniques.

Although the semiconductor device and method of the present invention has been described with regard to field effect transistors, the semiconductor device can be other types of devices. The semiconductor device can be a Schottky surface barrier junction diode with the diode junction being provided between the narrow metal film and the semiconductor body and the other metal films being contacts to the semiconductor body. The semiconductor device can also be a travelling-wave amplifier of the type described in the article by R. H. Dean et al. entitled "Travelling-Wave Amplifier Using Thin Epitaxial GaAs Layer," published in Electronic Letters, Vol. 6, No. 24, page 775, on Nov. 5, 1970.

I claim:

1. A method of making a semiconductor device comprising the steps of coating a first surface area of a body of a single crystalline semiconductor material with a first metal film, coating a second surface area of said body which is juxtaposed to said first surface area with a layer of a masking material with an edge of said masking layer extending at least to an edge of said first metal film, etching away a portion of the material of the masking layer from said edge thereof, to expose a portion of the body between said edges of the first metal film and the masking layer, etching a groove in said exposed portion of the body with the groove extending under at least one of the said edges of the first metal film or the masking layer so that said edge extends in cantilever fashion over said groove, and depositing a second metal film on the bottom of said groove with an edge of said second metal film being in substantially transverse alignment with the said cantilevered edge.

2. A method in accordance with claim 1 in which the masking layer is coated over the entire surface of the body, a portion of the masking layer is etched away to expose an area of the surface of the body, a portion of the exposed area of the body is etched away to expose the said first surface area of the body, the first metal film is coated over said first surface area, and then the masking layer is etched away from the adjacent edge of the first metal film to expose a portion of the body between the edges of the first metal film and said masking layer.

3. A method in accordance with claim 2 in which the body of the semiconductor material includes a first region of one conductivity type and a second region of the one conductivity type but of lower resistance than the first region over the first region, a portion of the second region is etched away to expose said first surface area which is on the first region, and the first metal film is coated on said first surface area and on the adjacent edge of the second region.

4. A method in accordance with claim 3 in which the groove is etched through the second region of the body and into the first region with the groove extending under the edges of the first metal film and the masking layer so that the edges of both the first metal film and the masking layer extend in cantilevered fashion over the groove.

5. A method in accordance with claim 4 in which the second metal film is deposited only on the area of the bottom of the groove between the cantilevered edges of the first metal film and the masking layer while said cantilevered edges shadow mask the portion of the groove thereunder.

6. A method in accordance with claim 2 in which the body of the semiconductor material is of one conductivity type, after the portion of the body is etched away a layer of a semiconductor material of the one conductivity type but of lower resistance than the body is coated on the said first surface area of the body, and the first metal film is coated on said semiconductor material layer.

7. A method in accordance with claim 6 in which the groove is etched into the body and the semiconductor material layer to extend under the edges of both the first metal film and the masking layer so that both said edges extend in cantilever fashion over the groove, and the second metal film is deposited only on the area of the bottom of the groove between the cantilevered edges while the cantilevered edges shadow mask the portions of the groove thereunder.

8. A method in accordance with claim 1 in which the body of the semiconductor material includes a first region of one conductivity type and a second region of the one conductivity type but of lower resistance than the first region over the first region, the first metal film is coated on a portion of the surface of the second region, the uncovered portion of the second region and a portion of the second region under an edge of the first metal film is etched away to expose the surface of the first region, the masking layer is of a transparent insulating material which is coated on the exposed surface of the first region and the edge of the second region under the edge of the first metal film, the portion of the insulating layer under the edge of the first metal film is etched away until the insulating layer has an edge laterally spaced from the edge of the first metal film and a portion of the surface of the first region is exposed between said laterally spaced edges, and the groove is etched in said exposed portion of the surface of the first region between said laterally spaced edges with the groove extending under the edge of the first metal film so that the edge of the first metal film extends in cantilevered fashion over the groove.

9. A method in accordance with claim 8 in which the second metal film is deposited on the area of the bottom of the groove which is only between the laterally spaced edges of the first metal film and the insulating layer with the cantilevered edge of the first metal film shadow masking the area of the groove thereunder.

10. A method in accordance with claim 9 in which the second metal film is also coated on the insulating layer.

11. A method in accordance with claim 9 in which the groove is etched to also extend under the edge of the insulating material so that the edge of the insulating material also extends in cantilever fashion over the grooves, and the second metal film is deposited only on the area of the bottom of the groove between the cantilevered edges of the first metal film and the insulating layer with said cantilevered edges shadow masking the portions of the groove thereunder.

* * * * *